(12) United States Patent
Mochizuki et al.

(10) Patent No.: US 6,383,015 B2
(45) Date of Patent: May 7, 2002

(54) STRUCTURE AND METHOD OF MOUNTING BRANCH CONNECTOR TO FLAT CIRCUIT

(75) Inventors: Shinji Mochizuki; Yuji Hatagishi, both of Shizuoka-ken (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/796,604

(22) Filed: Mar. 2, 2001

(30) Foreign Application Priority Data

Mar. 2, 2000 (JP) ........................................ 2000-057299

(51) Int. Cl.⁷ .............................................. H01R 12/24
(52) U.S. Cl. ........................... 439/492; 439/467; 29/844
(58) Field of Search ................................. 439/397, 409, 439/467, 492, 498, 598; 29/837, 838, 842, 844, 845

(56) References Cited

U.S. PATENT DOCUMENTS 3,966,295 A * 6/1976 Hyland et al.

FOREIGN PATENT DOCUMENTS

GB 2074399 A * 10/1981
JP 10-321273 12/1998

* cited by examiner

*Primary Examiner*—Khiem Nguyen
(74) *Attorney, Agent, or Firm*—Finnegan, Henderson, Farabow, Garrett & Dunner, L.L.P.

(57) ABSTRACT

Press contact terminals are held in terminal housing chambers of a housing body. A longitudinally intermediate part of a flat circuit is positioned above a top surface opening of the terminal housing chambers. Each conductor of the flat circuit is press-connected to each press contact terminal with a press contact jig. A cover is closed, thereby to fold the flat circuit in two in the vicinity of the press-connected part so that one part is overlaid on the press-connected part. The folded part is sandwiched between the cover and the housing body to be held in a connector housing.

7 Claims, 5 Drawing Sheets

STRUCTURE AND METHOD OF MOUNTING BRANCH CONNECTOR TO FLAT CIRCUIT

BACKGROUND OF THE INVENTION

1. Field of the Invention

This invention relates to a structure and a method of mounting a branch connector to a longitudinally intermediate part of a flat circuit such as a flexible flat cable (FFC) or a flexible printed circuit (FPC).

2. Description of the Related Art

As an example of a structure in which a branch connector is mounted to a longitudinally intermediate part of a flat circuit, a structure described in Japanese Patent Laid-Open Publication No. Hei-10-321273 is known.

In the structure, terminals are disposed perpendicularly to the front side of a flat circuit and connected to conductors of the flat circuit. The terminals are held in a housing of a branch connector arranged on the front side of the flat circuit. The housing is screwed and fixed to a stay which is disposed on the rear side of the flat circuit.

In the structure described in the above publication, the terminals are disposed perpendicularly to the flat circuit and connected thereto, and then held in the housing of the branch connector. The branch connector is thus mounted to the flat circuit, perpendicularly jutting therefrom. When a flat wiring layout is desired with the flat circuit and the branch connector all included, the branch connector part lacks in compactness.

SUMMARY OF THE INVENTION

This invention has been achieved with such points in mind.

It is therefore an object of the invention to provide a structure and a method of mounting a branch connector to a flat circuit, in which the flatness of the flat circuit is exploited to provide a flat wiring layout including the branch connector.

According to a first aspect of the invention, there is provided a structure of mounting a branch connector to a flat circuit, comprising: a branch connector having a connector housing; terminals being held in the connector housing of the branch connector; and a flat circuit having conductors in a longitudinally intermediate part of the flat circuit, the conductors being connected to the terminals, the flat circuit being arranged in parallel with the branch connector; wherein, the flat circuit is folded in two in the vicinity of the connected portion in the connector housing; and the folded portion of the flat circuit is housed in the connector housing.

According to a second aspect of the invention, as it depends from the first aspect, the flat circuit is folded in two so that one part is overlaid on the connected part.

Thus in this invention, the terminals and the folded part of the flat circuit may be held in the connector housing after connecting the terminals and the flat circuit, or the flat circuit may be folded in two after connecting the conductors of the flat circuit to the terminals which have previously been held in the connector housing.

In this structure, the terminals are disposed in parallel relationship with the flat circuit to be connected to the conductors, thereafter the flat circuit is folded in two to be overlaid on the connected part, and the folded part together with the terminals are held in the connector housing. Thus unlike a conventional structure in which a branch connector is attached to the flat circuit in the form of perpendicularly jutting therefrom, the flat circuit can be mounted to the branch connector in a parallel relationship so that the structure of the flat circuit and the branch connector is flat form and compact form such that a connector might be mounted to a terminal of a flat circuit. Thus the flatness of the flat circuit is exploited to realize a flat wiring layout including the branch connector.

Although the folded flat circuit is ultimately held in the connector housing, it is a sheet of the flat circuit which is connected to the terminals. Thus when the conductors of the flat circuit is press-connected to the terminals, or when pins provided at the terminals are stuck into the conductors of the flat circuit for conduction, the conductors and the terminals can be connected without applying too much load to the contact blades or pins.

In this regard, it is technically possible that the flat circuit is folded in two and thereafter the folded part is press-connected to the contact blades, or pins are stuck into the folded part for conduction. However this produces too much load to the contact blades or the pins, widening the blades or bending the pins.

Thus as described above, connecting the conductors and the terminals in a state where the flat circuit is in a sheet can eliminate the possibility of widening the contact blades or bending the pins, thereby to provide a positive and stable connection.

According to a third aspect of the invention, as it depends from the first or the second aspect, the terminals are press contact terminals with press contact blades to which the conductors in the longitudinally intermediate part of the flat circuit are press-connected.

Thus in this invention, the connection between the conductors and the terminals are ensured with ease when the conductors have a circular cross section.

According to a fourth aspect of the invention, as it depends from one aspect among the first to the third aspect, the connector housing includes a housing body with a plurality of terminal housing chambers and a cover coupled to the housing body with a hinge, and the terminal housing chamber holds the terminals and the cover is put over the housing body with the folded part of the flat circuit being held in the housing body.

Thus in this invention, since the connector housing includes the connector body and the cover, it is easy to connect the conductors of the flat circuit to their respective terminals all of which have previously been set in their respective terminal housing chambers of the housing body with the cover opened. After connecting the terminals and the flat circuit, the cover is laid over the housing body, thereby to hold the folded part of the flat circuit in the connector housing without undue stress. In particular, the cover is hinged to the housing body, the cover is tilted on the hinge to automatically fold the flat circuit without another folding step, which simplifies the mounting operation.

According to a fifth aspect of the invention, as it depends from one aspect among the first to the fourth aspect, the terminals adjacent to each other are divided with barrier plates formed integrally with the connector housing, and the flat circuit is provided with slits in its insulator, in which slits the barrier plates are inserted.

Thus in this invention, since the barrier plates are inserted into the slits formed in the insulator of the flat circuit, the insulation between the terminals is improved in reliability with the barrier plates. The barrier plates do not hinder the operation of connecting the flat circuit to the terminals.

According to a sixth aspect of the invention, there is provided a method of mounting a branch connector to a flat circuit comprising the steps of housing press contact terminals corresponding to conductors of the flat circuit in terminal housing chambers of a connector housing which includes a housing body with the terminal housing chambers and a cover coupled to the housing body to cover a top surface opening of the terminal housing chambers, placing a longitudinally intermediate part of the flat circuit in a sheet above the top surface opening of the terminal housing chambers, and press-connecting the conductors of the flat circuit to the press contact terminals within the terminal housing chambers, using a press contact jig, and folding the flat circuit in two in the vicinity of the connected part so that one part is overlaid on the connected part, and sandwiching the folded part between the cover and the housing body to hold it in the connector housing.

Thus in this invention, since the flat circuit is press-connected to the press contact terminals held in the terminal housing chambers of the housing body with the press contact jig, the conductors of the flat circuit can be easily connected to the press contact terminals. Thereafter the flat circuit is folded in two to be overlaid on the connected part and the folded part is sandwiched between the cover and the housing body to be held in the connector housing. This keeps the folded state (a U-turn state) without undue stress, protecting the connected part.

Further, since the folded part is held in the connector housing, unlike the conventional structure in which a branch connector is attached to a flat circuit in the form of perpendicularly jutting therefrom, the branch connector can be mounted to the flat circuit in the flat and compact form like a connector to be mounted to a terminal of a flat circuit. Thus the flatness of the flat circuit is exploited to enable a flat wiring layout including the branch connector.

Furthermore, since the press-connecting the flat circuit to the terminals is performed on the flat circuit in a sheet, the press contact blades are not subjected to too much load in press-contacting the conductors and the terminals, preventing widening the press contact blades, which improves reliability in connection.

According to a seventh aspect of the invention, as it depends from the sixth aspect, the cover is coupled to the housing body with a hinge at the fold side of the flat circuit, the cover is swung on the hinge to fold the flat circuit in two, and the folded part is sandwiched between the cover and the housing body to be held in the connector housing.

Thus in this invention, since the cover is tilted on the hinge to fold the flat circuit, the flat circuit is easily folded in the housing. This eliminates another process step of folding the flat circuit, simplifying the mounting operation.

BRIEF DESCRIPTION OF THE ACCOMPANYING DRAWINGS

The above and further objects and novel features of the invention will more fully appear from the following detailed description when the same is read in conjunction with the accompanying drawings, in which.

DETAILED DESCRIPTION OF THE PREFERRED EMBODIMENTS

With reference to the accompanying drawings, preferred embodiments of this invention will now be described.

Figure 2:
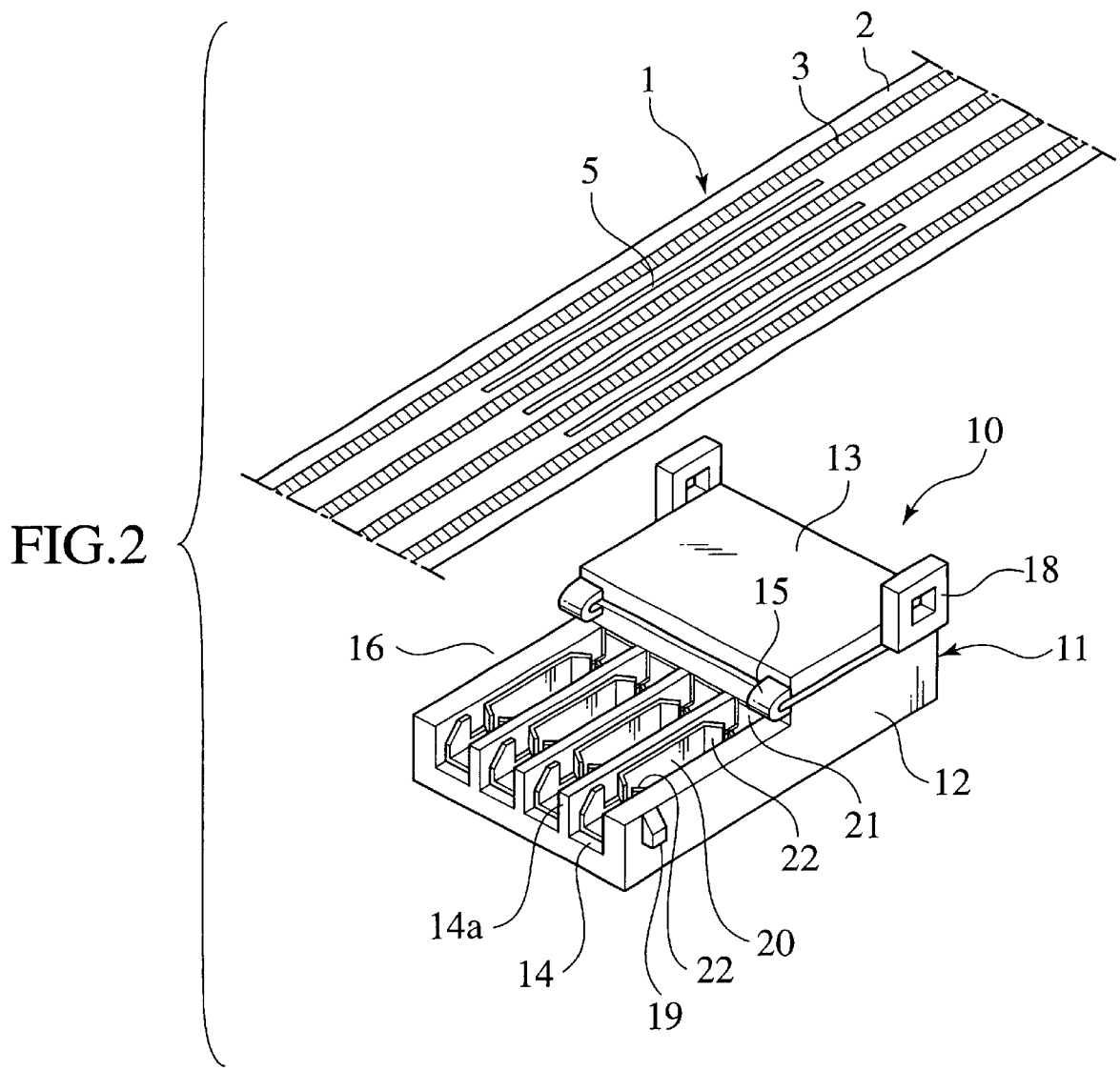
FIG. 2 is a perspective view showing structures of the branch connector and the flat circuit.

As shown in FIG. 2, a flat circuit 1 is provided with a plurality of conductors 3 embedded in a belt-like insulator 2 in parallel therewith. In the figure, the conductors 3 are shown in a hatch for the sake of convenience. In order to mount a branch connector 10 to a longitudinally intermediate part of the flat circuit 1, slits 5 are previously provided in areas of the insulator 2 between the conductors 3 to which the branch connector 10 is to be mounted, for avoiding interference with members of the branch connector 10 side.

Now the structure of the branch connector 10 will be described. As shown in FIG. 2, the branch connector 10 includes a connector housing 11 integrally molded with resin and a plurality of press contact terminals 20 incorporated into the connector housing 11. The connector housing 11 has a housing body 12 and a cover 13. The housing body 12 is provided with a plurality of terminal housing chambers 14 divided with barrier plates 14a. The terminal housing chambers 14 each hold the press contact terminals 20.

The press contact terminal 20 has at its front part a contact part 21 in a box-like shape which receives a terminal of another connector for conduction, and is provided at its rear part with press contact blades 22 which bite into the insulator of the flat circuit 1 to make contact with the conductors 3 therein.

The top surface of the rear half part of the terminal housing chambers 14 is opened to provide a top surface opening 16. The flat circuit 1 can be pressed from above toward the terminals 20 inside the terminal housing chambers 14 for connection.

The cover 13 is coupled to the housing body 12 with a hinge 15 at the front end of the top surface opening 16. The cover 13 can swing on the hinge 15 to block the top surface opening 16. The cover 13 closed is locked to the housing body 12 with locking means 18, 19.

To mount the branch connector 10 to a longitudinally intermediate part of the flat circuit 1, the branch connector 10 is first placed in a press contact machine.

Figure 1A:
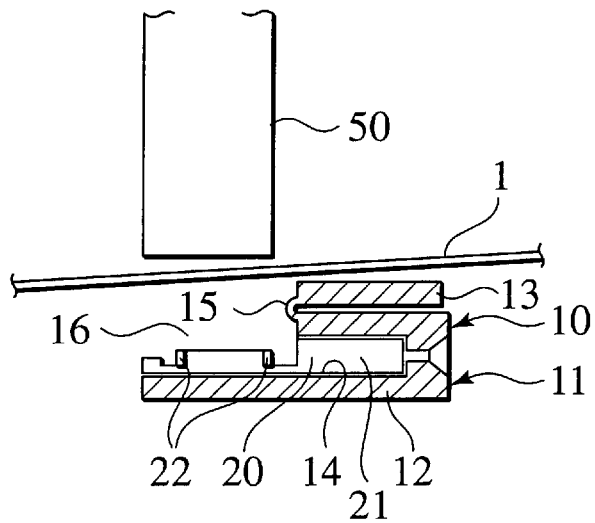
FIGS. 1A to 1D are sectional views showing a process of mounting a branch connector to a flat circuit according to an embodiment of this invention.

Then the longitudinally intermediate part of the flat circuit 1 in a sheet (not bent) is horizontally placed above the top surface opening 16 of the terminal housing chambers 14 of the branch connector 10 as shown in FIG. 1A.

Figure 1B:
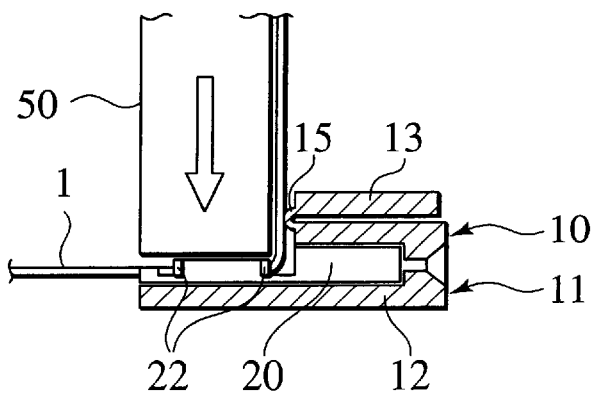
Figure 3:
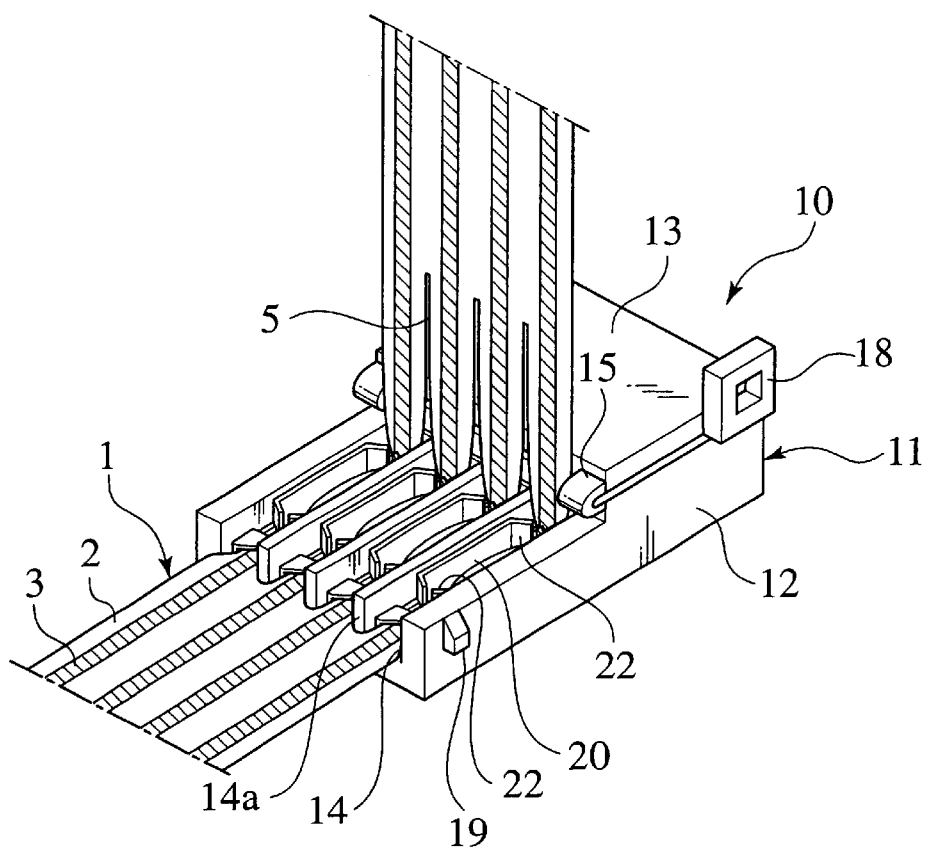
FIG. 3 is a perspective view showing a state where the flat circuit is press-connected to press contact terminals of the branch connector.

In this state, a press contact jig 50 is moved downwardly as shown in FIG. 1B to press and make the conductors 3 of the flat circuit 1 above the terminal housing chambers 14 (see FIGS. 2 and 3) come into contact with the press contact blades 22 of the press contact terminals 20 in the terminal housing chambers 14. The flat circuit 1 is pressed and bent by the press contact jig 50. At the completion of the press contact, the flat circuit 1 is bent at an angle of approximately 90° as shown in FIG. 3.

Figure 1C:
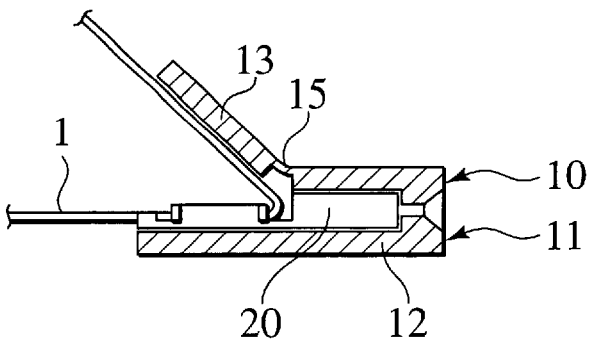
Figure 1D:
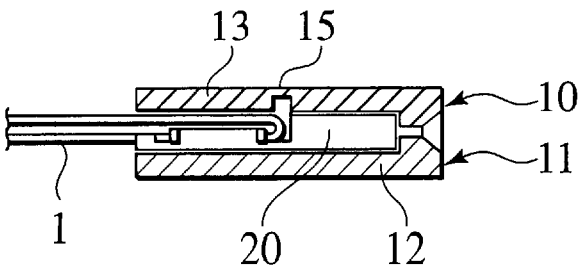
Figure 4:
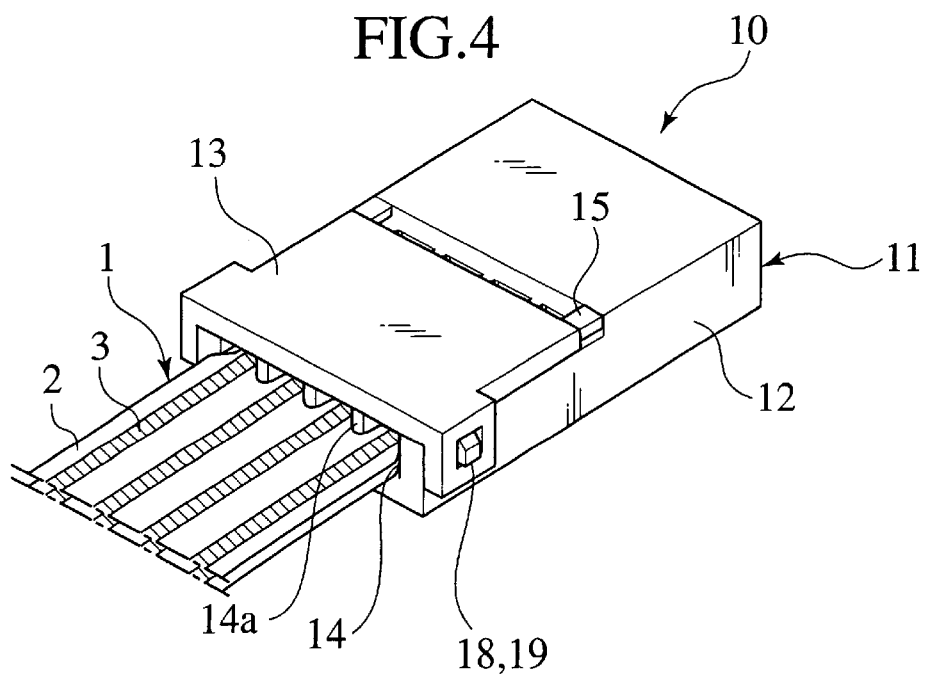
FIG. 4 is a perspective view showing a final appearance of the branch connector mounted to the flat circuit.

The press contact jig 50 is then removed, and the cover 13 is swung down on the hinge 15 as shown in FIG. 1C. The flat circuit 1 is, as shown in FIG. 1D, pushed by the cover 13 and folded in two in the vicinity of the press-connected part so that one part is overlaid on the press-connected part. The folded part is sandwiched between the cover 13 and the housing body 12 to be held in the connector housing 11. Finally the cover 13 is locked to the housing body 12 with the locking means 18, 19 as shown in FIG. 4 to complete the structure in which the branch connector 10 is mounted to the U-shaped folded part of the flat circuit 1.

In this structure, the barrier plates 14a between the terminal housing chambers 14 are inserted in the slits 5 formed in the insulator 2 of the flat circuit 1. Thus the insulator 2 does not hinder the press connection of the flat circuit 1 to the press contact terminals 20.

Unlike the conventional structure where a branch connector is mounted to a flat circuit in the form of perpendicularly jutting therefrom, the branch connector 10 is flatly and compactly mounted to the flat circuit 1 like a connector mounted to an end of a flat circuit. Thus, as shown in FIGS. 1D and 4, the flatness of the flat circuit 1 is effectively utilized to enable a flat wiring layout with the branch connector 10 included.

In the final stage of the mounting as shown in FIG. 1D, the flat circuit 1 is folded in two to be held in the connector housing 11. As shown in FIGS. 1B and 3, it is the flat circuit 1 in a sheet that is connected to the press contact terminals 20. Thus the press-connecting the conductors 3 in the flat circuit 1 to the press contact terminals 20 does not apply too much load to the press contact blades 22, improving reliability in connection between the conductors 3 and the press contact terminals 20.

Figure 6:
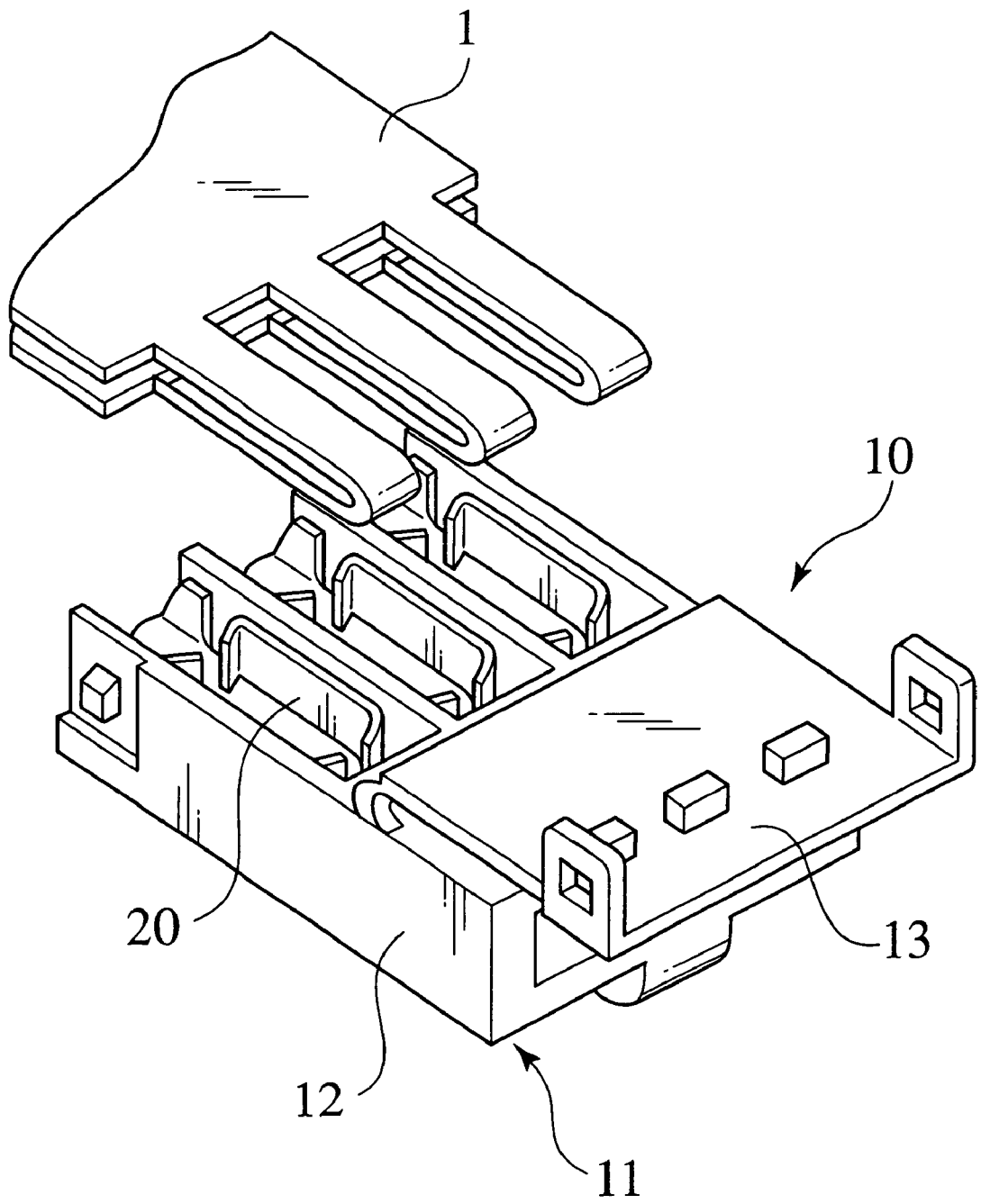
FIG. 6 is an explanatory view showing a comparative example with respect to the embodiments of this invention.

It is technically possible to fold the flat circuit 1 in two and then to press-connect the folded part to the press contact blades 22 of the contact terminals 20 as shown in a comparative example of FIG. 6. In this case, however, the press contact blades 22 are subjected to too much load to be widened, resulting in a possibility of damaging the reliability in connection. In the above-described embodiment, the conductors 3 in the flat circuit 1 in a sheet is connected to the press contact terminals 20, eliminating the possibility of widening the press contact blades 22, which results in a positive stable connection.

To connect conductors in a flat circuit to terminals, it is possible to use a method in which a terminal is provided with a pin which is stuck into a conductor over an insulator. In the above embodiment, since the flat circuit 1 is press-connected to the press contact blades 22 of the press contact terminals 20, the conductors and the terminals can be easily and surely conducted, especially in the case where the conductors 3 in the flat circuit 1 have a circular cross section.

Further, since the connector housing 11 consists of the housing body 12 and the cover 13, and the press contact can be performed with the cover 13 opened, the conductors 3 of the flat circuit 1 can be easily connected to the press contact terminals 20 which are previously placed in the terminal housing chambers 14.

After connecting the press contact terminals 20 and the flat circuit 1, the cover 13 is put over the housing body 12, thereby to be able to fold the flat circuit 1 in two with the cover 13 without previously folding the flat circuit 1. The cover 13 is locked to the housing body 12, thereby to be able to hold the folded part stably in the connector housing 11 without undue stress.

Further, since the slits 5 are previously formed in the insulator 2 of the flat circuit 1 and the barrier plates 14a dividing the press contact terminals 20 are inserted in the slits 5, the press-connected parts are certainly insulated with the barrier plates 14a. The barrier plates 14a do not obstruct the press connecting of the flat circuit 1 to the press contact terminals 20.

In the above embodiment, the flat circuit 1 is folded in two by tiling the cover 13. The cover may be swung down after folding the flat circuit 1 in two.

Further in the above embodiment, the flat circuit 1 is press-connected to the press contact terminals 20 which are previously held in the connector housing 11, and then the cover 13 is tilted to fold the flat circuit 1 in two to hold it in the connector housing 11. It is also possible to connect the conductors of the flat circuit to the terminals before the terminals are held in the connector housing, and to fold the flat circuit in two and thereafter house the folded part together with the terminals in the connector housing.

Figure 5:
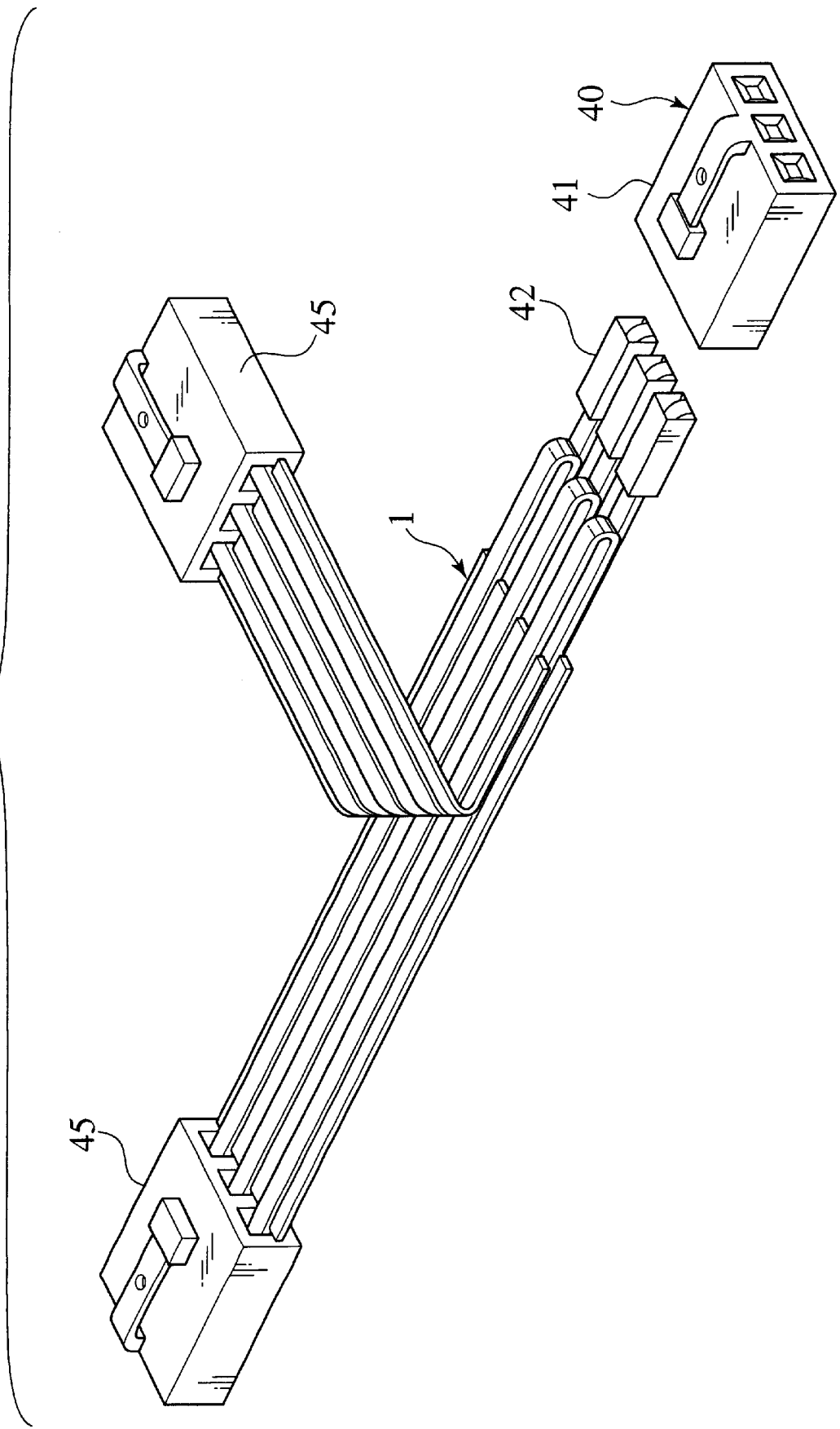
FIG. 5 is a perspective view showing an overview of another embodiment of this invention.

FIG. 5 shows an embodiment of such a structure. In the FIG., reference numeral 40 designates a branch connector, 41 a connector housing, and 42 a terminal. Reference numeral 45 designates connectors at both ends of the flat circuit 1. The terminal 42 of this example may be a press contact terminal or a terminal with a pin. The flat circuit 1 is connected to the terminals 42 before inserting the terminals 42 into the connector housing 41. After connected, the flat circuit 1 is folded in two and the terminals 42 together with the folded part are inserted into the connector housing 41. Thus the mounting of the branch connector 40 is finished.

The entire contents of Japanese Patent Application 2000-057299 (filed on Mar. 2, 2000) are incorporated herein by reference.

Although the invention has been described above by reference to certain embodiments of the invention, the invention is not limited to the embodiments described above. Modifications and variations of the embodiments described above will occur to those skilled in the art, in light of the above teachings. The scope of the invention is defined with reference to the following claims.

What is claimed is:

1. A structure for mounting a branch connector to a flat circuit, comprising:
    a branch connector having a connector housing comprising a housing body and a cover coupled to the housing body with a hinge;
    terminals held in the connector housing of the branch connector; and
    a flat circuit having conductors embedded in a longitudinally intermediate part of the flat circuit, the conductors being connected to the terminals in a connecting portion, the flat circuit being arranged in parallel with the branch connector; wherein,
    the flat circuit is folded at a folding portion in the vicinity of the connected portion within the connector housing; and the folding portion of the flat circuit is housed in the connector housing.

2. A structure for mounting a branch connector to a flat circuit as set forth in claim 1, wherein one side of the folded flat circuit lies over the connected portion.

3. A structure for mounting a branch connector to a flat circuit as set forth in claim 2, wherein the terminals are press contact terminals with press contact blades, and the conductors are press-connected in the press contact terminals.

4. A structure for mounting a branch connector to a flat circuit as set forth in claim 3, wherein the housing body of the connector housing comprises a plurality of terminal housing chambers that hold the terminals, and the cover is put over the housing body with the folding portion of the flat circuit being held in the housing body.

5. A structure for mounting a branch connector to a flat circuit as set forth in claim 4, wherein the terminals adjacent to each other are divided with barrier plates formed integrally with the connector housing; and the flat circuit is provided with slits in spaces between the conductors, the barrier plates being inserted in the slits.

6. A method of mounting a branch connector to a flat circuit, comprising the steps of:

housing press contact terminals corresponding to conductors of the flat circuit in terminal housing chambers of a connector housing comprising a housing body with the terminal housing chambers and a cover coupled to the housing body to cover top surface openings of the terminal housing chambers;

placing a longitudinally intermediate part of the flat circuit in a sheet above the top surface openings of the terminal housing chambers, and press-connecting the conductors of the flat circuit the press contact terminals of the terminal housing chambers by using a press contact jig; and folding the flat circuit in two in the vicinity of the connected portion so that one side of the flat circuit lies over the connected portion, and sandwiching the folded portion between the cover and the housing body to hold the folded portion in the connector housing.

7. A method of mounting a branch connector to a flat circuit as set forth in claim 6, wherein the cover is coupled to the housing body with a hinge; and the cover is swung on the hinge to fold the flat circuit.

* * * * *

UNITED STATES PATENT AND TRADEMARK OFFICE
CERTIFICATE OF CORRECTION

PATENT NO.   : 6,383,015 B2
DATED        : May 7, 2002
INVENTOR(S)  : Shinji Mochizuki and Yuji Hatagishi It is certified that error appears in the above-identified patent and that said Letters Patent is hereby corrected as shown below:

Column 8,
Line 1, after "flat circuit", insert -- to --.

Signed and Sealed this

Twenty-second Day of October, 2002

Attest:

Attesting Officer

JAMES E. ROGAN
Director of the United States Patent and Trademark Office